(12) United States Patent
Nam

(10) Patent No.: US 10,026,928 B2
(45) Date of Patent: Jul. 17, 2018

(54) DISPLAY APPARATUS AND METHOD OF MANUFACTURING THE SAME

(71) Applicant: SAMSUNG DISPLAY CO., LTD., Yongin-si, Gyeonggi-Do (KR)

(72) Inventor: Wijin Nam, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/367,912

(22) Filed: Dec. 2, 2016

(65) Prior Publication Data

US 2017/0179433 A1 Jun. 22, 2017

(30) Foreign Application Priority Data

Dec. 22, 2015 (KR) ........................ 10-2015-0184081

(51) Int. Cl.
*H01L 51/52* (2006.01)
*H01L 27/32* (2006.01)
*H01L 51/00* (2006.01)
*H01L 51/56* (2006.01)

(52) U.S. Cl.
CPC ...... *H01L 51/5256* (2013.01); *H01L 27/3262* (2013.01); *H01L 51/0096* (2013.01); *H01L 51/5237* (2013.01); *H01L 51/56* (2013.01)

(58) Field of Classification Search
CPC ............. H01L 27/3262; H01L 51/0096; H01L 51/5237; H01L 51/5256; H01L 51/56
See application file for complete search history.

(56) References Cited

U.S. PATENT DOCUMENTS

| 2010/0238098 A1* | 9/2010 | Watanabe ............. G02F 1/1339 345/87 |
| 2012/0161197 A1 | 6/2012 | Im et al. |
| 2012/0256202 A1* | 10/2012 | Lee ..................... H01L 51/5256 257/88 |
| 2014/0197380 A1* | 7/2014 | Sung ................... H01L 27/3241 257/40 |
| 2015/0123106 A1* | 5/2015 | Yasumoto ............. B32B 43/006 257/40 |
| 2015/0156867 A1 | 6/2015 | Kim et al. |
| 2016/0095172 A1* | 3/2016 | Lee ....................... C23C 16/401 313/504 |
| 2017/0148864 A1* | 5/2017 | Wu ..................... H01L 27/3276 |

FOREIGN PATENT DOCUMENTS

| JP | 2009-069768 | 4/2009 |
| JP | 2014-035387 | 2/2014 |
| KR | 1020120042437 | 5/2012 |
| KR | 1020120071962 | 7/2012 |
| KR | 1020150062671 | 6/2015 |

* cited by examiner

*Primary Examiner* — Allan R Wilson
(74) *Attorney, Agent, or Firm* — F. Chau & Associates, LLC

(57) ABSTRACT

A display apparatus includes a substrate including a curved display area and a peripheral area disposed around the curved display area, a curved display unit disposed in the curved display area, and a thin film encapsulation layer which seals the curved display unit. In plan view, an edge of the thin film encapsulation layer comprises a first straight portion, a second straight portion separated from the first straight portion, and a curved portion disposed between the first and second straight portions.

20 Claims, 7 Drawing Sheets

DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2015-0184081, filed on Dec. 22, 2015, in the Korean Intellectual Property Office, the disclosure of which is incorporated by reference herein in its entirety.

TECHNICAL FIELD

The present invention relates to display apparatuses, and more particularly, to display apparatuses having a circular display region.

DISCUSSION OF THE RELATED ART

A display apparatus may be used to display images. Examples of display apparatuses include liquid crystal display apparatuses, electrophoretic display apparatuses, organic light-emitting diode display apparatuses, inorganic light-emitting display apparatuses, field emission display apparatuses, surface-conduction electron-emitter display apparatuses, plasma display apparatuses, cathode ray display apparatuses, and the like.

Impurities may reduce the image quality of a display apparatus.

SUMMARY

Exemplary embodiments of the present invention relate to a display apparatus having a circular display area and a method of manufacturing the same.

Exemplary embodiments of the present invention relate to a method of manufacturing a display apparatus which minimizes stress applied to a thin film encapsulation layer, and to a display apparatus having a good image quality.

According an exemplary embodiment of the present invention, a display apparatus includes a substrate including a curved display area and a peripheral area disposed around the curved display area, a curved display unit disposed in the curved display area, and a thin film encapsulation layer which seals the curved display unit. In plan view, an edge of the thin film encapsulation layer includes a first straight portion, a second straight portion separated from the first straight portion, and a curved portion disposed between the first and second straight portions.

According an exemplary embodiment of the present invention, a method of manufacturing a display apparatus includes providing a substrate including a circular display area and a peripheral area disposed around the circular display area, forming a circular display unit in the circular display area, forming a thin film encapsulation layer on the circular display unit, and sealing the circular display unit on the substrate with the thin film encapsulation layer, and forming an upper film on the thin film encapsulation layer. In plan view, an edge of the thin film encapsulation layer includes a first straight portion, a second straight portion separated from the first straight portion, and a curved portion disposed between the first and second straight portions.

According an exemplary embodiment of the present invention, a display apparatus includes a substrate including a circular display area and a peripheral area disposed at a border of the circular display area, a circular display unit disposed in the circular display area, and a thin film encapsulation layer disposed on the circular display unit. The circular display unit is disposed between the substrate and the thin film encapsulation layer. The circular display unit is encapsulated by the substrate and thin film encapsulation layer. The thin film encapsulation layer includes at least two straight edges connected to each other by a curved edge.

BRIEF DESCRIPTION OF THE DRAWINGS

The above and other aspects of the present invention will become more apparent by describing in detail exemplary embodiments thereof in conjunction with the accompanying drawings, in which.

DETAILED DESCRIPTION OF THE EMBODIMENTS

Figure 1:
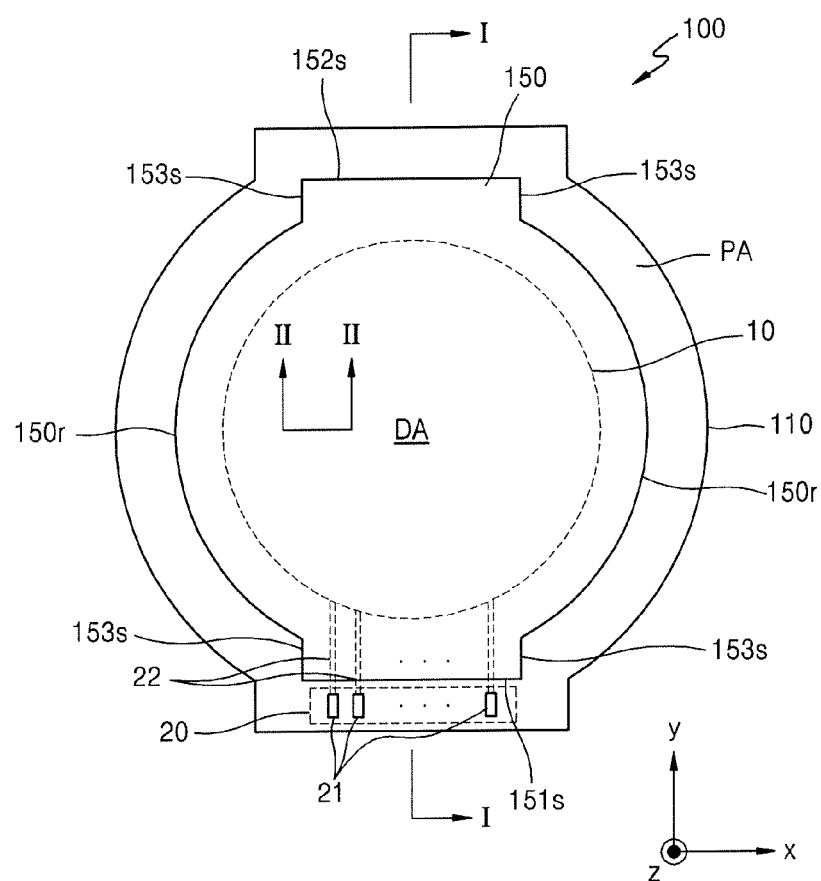
FIG. 1 is a plan view of a display apparatus according to an exemplary embodiment of the present invention.

Exemplary embodiments of the present invention will now be described more fully hereinafter with reference to the accompanying drawings. The present invention may, however, be embodied in different forms and should not be construed as being limited to the embodiments disclosed herein.

Like reference numerals may refer to like elements throughout the specification. In the drawings, the sizes and/or proportions of elements, layers, and/or regions may be exaggerated for clarity.

When referring to an element the singular form, the referral in the singular form may also encompass the plural form of the element, unless the context clearly indicates otherwise.

When an exemplary embodiment of the present invention may be implemented differently, a process order may be performed differently from the described order. For example, two consecutively described processes may be performed substantially at the same time or performed in an order opposite to the described order.

A display apparatus may display an image. The display apparatus may be a liquid crystal display apparatus, an electrophoretic display apparatus, an organic light-emitting diode display apparatus, an inorganic light-emitting display apparatus, a field emission display apparatus, a surface-conduction electron-emitter display apparatus, a plasma display apparatus, a cathode ray display apparatus, or the like.

Exemplary embodiments of the present invention will be described with reference to an organic light-emitting diode display device. However, it is understood that the present invention may be embodied in any one of the types of display devices listed above.

Figure 2:
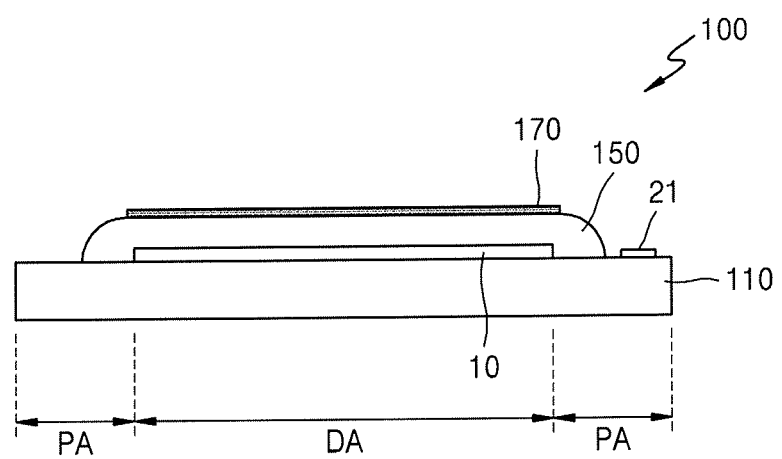
FIG. 2 is a cross-sectional view taken along line I-I' of FIG. 1.

FIG. 1 is a plan view of a display apparatus according to an exemplary embodiment of the present invention. FIG. 2 is a cross-sectional view taken along line I-I' of FIG. 1.

Referring to FIGS. 1 and 2, a display apparatus 100 may include a substrate 110, a display unit 10, and a thin film encapsulation layer 150. The display apparatus 100 may further include an upper film 170 disposed on the thin film encapsulation layer 150. A pad unit 20 may be disposed on a peripheral area PA of the substrate 110.

The substrate 110 may include a display area DA, on which an image is displayed, and the peripheral area PA disposed around the display area DA.

The substrate 110 may include various materials, for example, glass, metal, or plastic. According to an exemplary embodiment of the present invention, the substrate 110 may include a flexible material. The terms "substrate 110" and a "flexible material substrate 110" may be interchangeably used to describe the substrate 110. The flexible material substrate 110 may be bent, folded, or rolled. The flexible material substrate 110 may include ultra slim glass, metal, or plastic. For example, when plastic is used in the flexible material substrate 110, the flexible material substrate 110 may include polyimide (PI). However, the flexible material substrate 110 may also include other flexible plastics or other flexible materials.

The display unit 10 may display an image through the display area DA of the flexible material substrate 110. The display unit 10 may include a plurality of pixels for displaying an image.

The display unit 10 may include, for example, a thin film transistor (TFT), an organic light-emitting diode (OLED), and a capacitor (Cst).

The display unit 10 may include signal lines such as gate lines that transmit gate signals to the pixels of the display unit 10, and data lines that transmit data signals to the pixels of the display unit 10. Each of the pixels may be formed by an electrical combination of a TFT and an OLED connected to a gate line and a data line. Thus, the pixels may display an image. The plurality of pixels may be arranged in various ways, for example, in a stripe arrangement or a pentile arrangement.

When the display area DA and/or the display unit 10 is viewed from above (e.g., in plan view), the display area DA and/or the display unit 10 may have a circular shape. In an exemplary embodiment of the present invention, the term "circular shape" may refer to a completely circular shape, or to a curved shape such as an elliptical shape, an oval shape, or to a shape having a curved boundary.

An image is not displayed through the peripheral area PA. The peripheral area PA may have a donut shape and may circumscribe the display area DA, but the peripheral area PA may also have other shapes. The peripheral area PA may be disposed adjacent to an edge of the flexible material substrate 110. In the peripheral area PA, a dam unit and/or a groove may be disposed at the pad unit 20 for stopping the flow of the organic film included in the thin film encapsulation layer 150.

The pad unit 20 may be disposed in the peripheral area PA of the flexible material substrate 110. The pad unit 20 may receive a driving signal for driving the display unit 10 from an external circuit. The driving signal may include a gate signal or a data signal. The pad unit 20 may include a plurality of sub-pads 21. Each of the sub-pads 21 may receive at least one gate signal or at least one data signal (e.g., a driving signal) for driving the display unit 10, and may output the received driving signal to the display unit 10. The pad unit 20 may be connected to a base film on which the external circuit may be mounted. The driving signal may be transmitted from the external circuit, through the pad unit 20, to the display unit 10. In addition, the external circuit may be disposed in the peripheral area PA.

Each of the sub-pads 21 may be connected to a pixel circuit of the display unit 10 through fanout wires 22. Accordingly, the sub-pads 21 may transmit the driving signals received from the external circuit to the pixel circuit through fanout wires 22.

Both the sub-pads 21 and the fanout wires 22 may be formed on the same layer, or they may be formed on different layers. For example, the fanout wires 22 may be formed on a lower layer (e.g., a different layer) than the layer on which the sub-pads 21 are disposed, and may be connected to the sub-pads 21 through contact holes.

The thin film encapsulation layer 150 prevents external air, including moisture and/or oxygen, from penetrating into the display unit 10. The thin film encapsulation layer 150 may surround an upper surface and/or side surfaces of the display unit 10. Accordingly, the display unit 10 may be encapsulated by the substrate 110 and the thin film encapsulation layer 150.

In an exemplary embodiment of the present invention, the thin film encapsulation layer 150 may include an inorganic film and/or an organic film. The thin film encapsulation layer 150 may be formed by alternately stacking a plurality of inorganic films and a plurality of organic films. The uppermost layer of the thin film encapsulation layer 150, exposed to the outside, may include an inorganic film to prevent moisture from penetrating into the OLEDs.

The inorganic film may include a single layer film or a plurality of layers stacked on one another. The inorganic film may include a metal oxide or a metal nitride. The sub-pads 21 may include SiNx, $Al_2O_3$, $SiO_2$, $TiO_2$, or SiON.

The organic film may include a single layer film or a plurality of layers stacked on one another. The organic film may include polyethylene terephthalate (PET), polyimide, polycarbonate, epoxy, polyethylene, or polyacrylate.

In an exemplary embodiment of the present invention, the thin film encapsulation layer 150 may polarize light. For example, the thin film encapsulation layer 150 may include a polarizing layer including a polarizer. Thus, the thin film encapsulation layer 150 may polarize, block and/or reflect light.

On a plan view, an edge of the thin film encapsulation layer 150 may include a first straight portion 151s, a second straight portion 152s separated from the first straight portion 151s, and a curved portion 150r disposed between the first straight portion 151s and the second straight portion 152s.

The edge of the thin film encapsulation layer 150 may further include an auxiliary straight portion 153s (e.g., a third straight portion) that connects the first straight portion 151s to the curved portion 150r. The first straight portion 151s and the second straight portion 152s may be substantially parallel to each other. However, the present invention is not limited thereto, and the first straight portion 151s and the second straight portion 152s may be formed to have a predetermined angle with respect to each other, (for example, a predetermined angle in a range of about 0 degrees to about 20 degrees). The first straight portion 151s and the second straight portion 152s may face each other.

The curved portion 150r may have a circular shape corresponding to the shape of the display unit 10. In an exemplary embodiment of the present invention, the curved portion 150r may be formed with a constant radius of curvature.

The first straight portion 151s, the second straight portion 152s, and the auxiliary straight portion 153s may be substantially straight in a macroscopic view (e.g., zoomed out view, or unmagnified view). However, when thin film encapsulation layer 150 is magnified, the first straight portion 151s, the second straight portion 152s, and the auxiliary straight portion 153s may each have small (e.g., microscopic) bends, zig-zag, sawtooth, and/or curved portions.

Similarly, the curved portion 150r may be curved in a macroscopic view. However, when magnified, the curved portion 150r may have small (e.g., microscopic) bends, zig-zag, and/or sawtooth, portions).

The first straight portion 151s and the second straight portion 152s are formed on the edge of the thin film encapsulation layer 150 to reduce damage to the thin film encapsulation layer 150 when the upper film 170 is attached to the thin film encapsulation layer 150, as described below.

The pad unit 20 may not be sealed by the thin film encapsulation layer 150. The pad unit 20 may be disposed adjacent to the first straight portion 151s or the second straight portion 152s of the edge of the thin film encapsulation layer 150. However, the location of the pad unit 20 is not limited thereto, and the pad unit 20 may also be disposed adjacent to the curved portion 150r.

The flexible material substrate 110 may have various shapes in plan view, for example, a circular shape, an oval shape, or a polygonal shape. In an exemplary embodiment of the present invention, the flexible material substrate 110 may have a straight portion and a curved portion to correspond to the shape of the thin film encapsulation layer 150.

The upper film 170 may be disposed on the thin film encapsulation layer 150.

The upper film 170 may include, for example, a polarizing film, a touch screen panel film, or a protection film.

In an exemplary embodiment of the present invention, the upper film 170 may include a polarizing film. When the upper film 170 includes a polarizing film, the upper film 170 may prevent an image quality from being reduced by the reflection of light entering from the outside. In this case, the upper film 170 may include more than one layer having a light-polarizing characteristic.

When the upper film 170 includes a touch screen panel film, the upper film 170 may include sensing patterns and metal wires, and the variation of capacitances of the sensing patterns may be directly transmitted to an integrated circuit through the metal wires.

The upper film 170 may include a stack of films having various functions. For example, the upper film 170 may include a polarizing film, a touch screen panel film, and a protection film stacked on each other. The upper film 170 may be attached to the thin film encapsulation layer 150 by using a lamination method.

Figure 3:
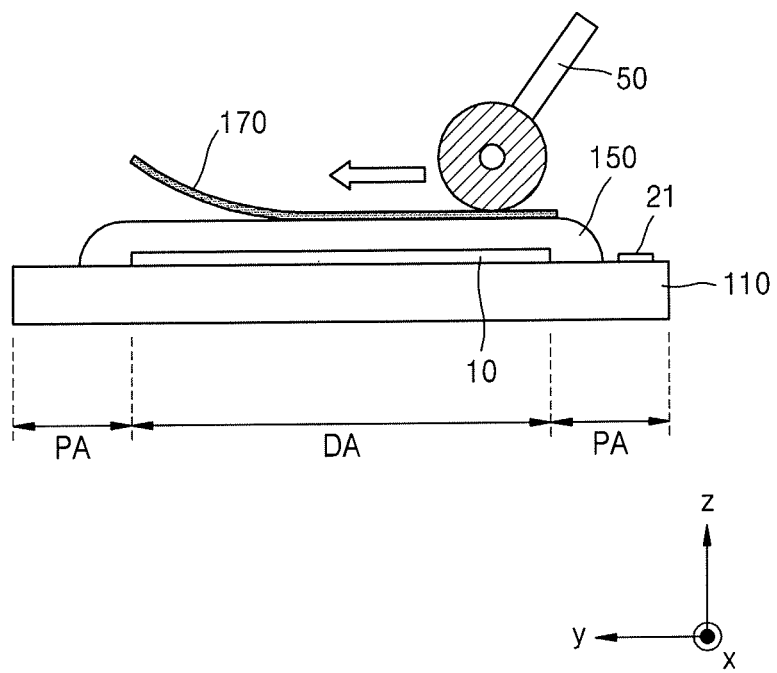
FIG. 3 is a cross-sectional view illustrating a method of attaching an upper film on a display apparatus, according to an exemplary embodiment of the present invention.

FIG. 3 is a cross-sectional view illustrating a method of attaching the upper film 170 on the display apparatus 100, according to an exemplary embodiment of the present invention.

Referring to FIGS. 1 and 3, the upper film 170 may be attached to the thin film encapsulation layer 150 by using a lamination process. For example, the upper film 170 may be attached by laying the upper film 170 on the thin film encapsulation layer 150 and pressing a roller 50 on the upper film 170. In this case, the roller 50 may move in a direction from the first straight portion 151s towards the second straight portion 152s (a +y direction), or from the second straight portion 152s towards the first straight portion 151s (a −y direction).

While the lamination process is being performed, the roller 50 applies pressure to the upper film 170 and the thin film encapsulation layer 150. When the roller 50 attaches the upper film 170 to the thin film encapsulation layer 150 by moving in a direction of the curved portion 150r (for example, in an x direction), a crack may occur in an inorganic film included in the thin film encapsulation layer 150 because stress concentrates on an edge of the thin film encapsulation layer 150 in the moving direction of the roller 50.

When the roller 50 attaches the upper film 170 to the thin film encapsulation layer 150 by moving in a direction from the first straight portion 151s towards the second straight portion 152s (the +y direction), stress may be uniformly distributed on the second straight portion 152s. Accordingly, a crack may not occur in the thin film encapsulation layer 150.

Figure 4:
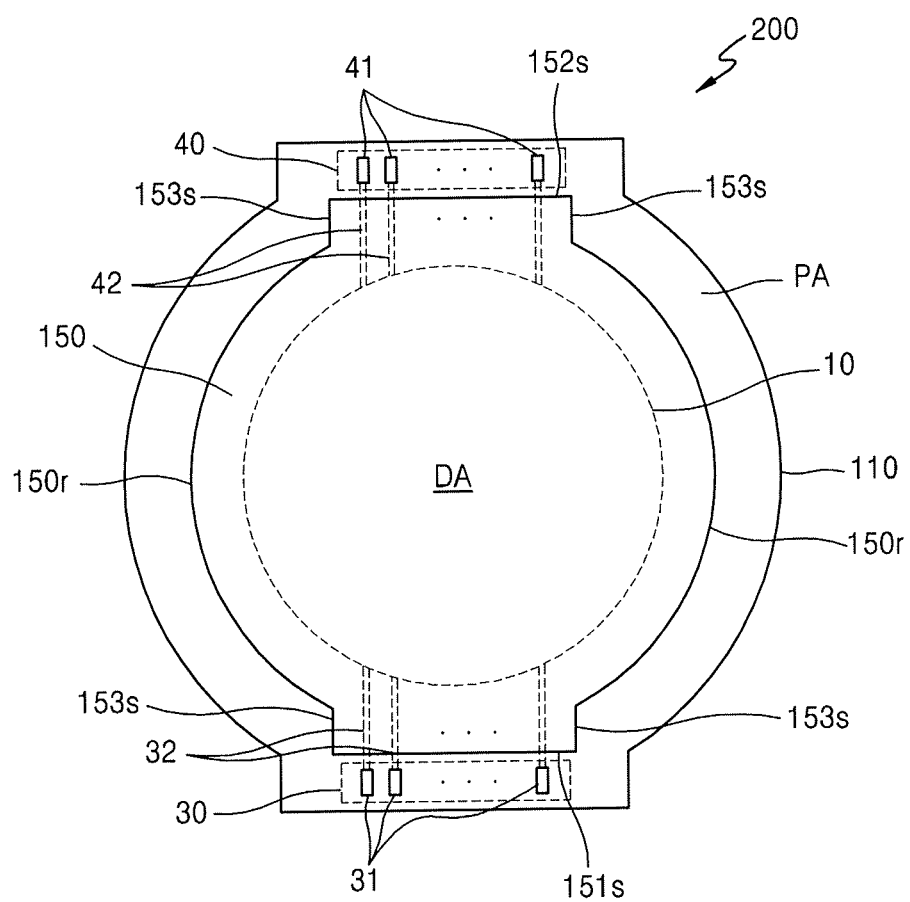
FIG. 4 is a plan view of a display apparatus according to an exemplary embodiment of the present invention.
Figure 5:
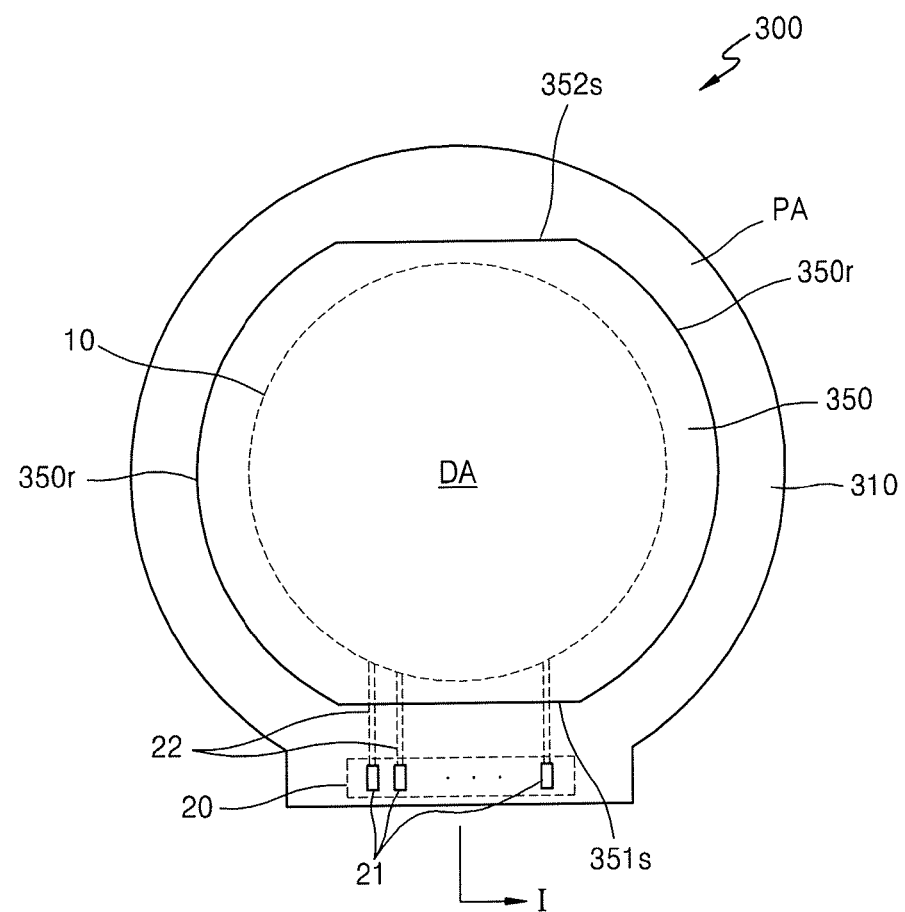
FIG. 5 is a plan view of a display apparatus according to an exemplary embodiment of the present invention.
Figure 6:
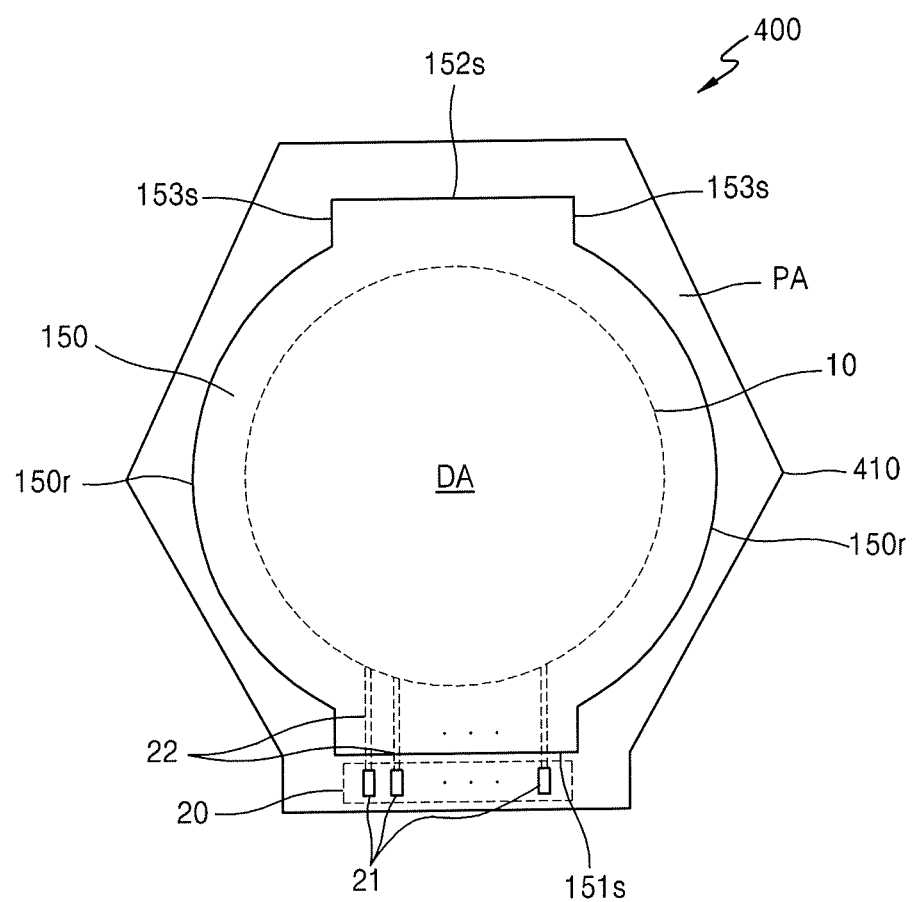
FIG. 6 is a plan view of a display apparatus according to an exemplary embodiment of the present invention.

FIG. 4 is a plan view of a display apparatus according to an exemplary embodiment of the present invention. FIG. 5 is a plan view of a display apparatus according to an exemplary embodiment of the present invention. FIG. 6 is a plan view of a display apparatus according to an exemplary embodiment of the present invention.

Referring to FIG. 4, a display apparatus 200 includes the flexible material substrate 110, which includes a circular display area DA and a peripheral area PA disposed around the display area DA, a display unit 10 disposed in the display area DA, and a thin film encapsulation layer 150 that seals the display unit 10. In plan view, an edge of the thin film encapsulation layer 150 includes a first straight portion 151s, a second straight portion 152s separated from the first straight portion 151s, and a curved portion 150r disposed between the first straight portion 151s and the second straight portion 152s.

The display apparatus 200 may include a first pad unit 30 and a second pad unit 40 that are disposed in the peripheral area PA. The first pad unit 30 may be disposed adjacent to the first straight portion 151s of the thin film encapsulation layer 150, and the second pad unit 40 may be disposed adjacent to the second straight portion 152s.

The first pad unit 30 and the second pad unit 40 may each receive driving signals for driving the display unit 10 from one or more external circuits. Each of the driving signals may include a gate signal or a data signal. The first pad unit 30 and the second pad unit 40 may respectively include a plurality of sub-pads 31 and 41. Each of the sub pads 31 and 41 may receive at least one gate signal or at least one data signal (e.g., the driving signals) for driving the display unit 10 from the one or more external circuits. The driving signals may be transmitted from the one or more external circuits, through the pad units 30 and 40, to the display unit 10.

The sub-pads 31 and 41 may be respectively connected to a pixel circuit of the display unit 10 through fanout wires 32 and 42. Accordingly, the sub-pads 31 and 41 may transmit the driving signals received from the one or more external circuits to the pixel circuit through the fanout wires 32 and 42.

The sub-pads 31 and 41 and the fanout wires 32 and 42 may be disposed on the same layer, or on different layers. For example, the fanout wires 32 and 42 may be disposed on a lower layer (e.g., a different layer) than the layer on which the sub-pads 31 and 41 are disposed, and may be connected to the sub-pads 31 and 41 through contact holes.

The first pad unit 30 and the second pad unit 40 may not be sealed by the thin film encapsulation layer 150. The display apparatus 200 may further include an additional pad unit disposed adjacent to the curved portion 150r of the thin film encapsulation layer 150, in addition to the first pad unit 30 and the second pad unit 40.

Referring to FIG. 5, a display apparatus 300 includes a substrate 310, which includes a circular display area DA and a peripheral area PA disposed around the display area DA, a display unit 10 disposed in the display area DA, and a thin film encapsulation layer 350 that seals the display unit 10. In plan view, an edge of the thin film encapsulation layer 350 includes a first straight portion 151s, a second straight portion 152s separated from the first straight portion 151s, and a curved portion 150r disposed between the first straight portion 151s and the second straight portion 152s.

The first straight portion 351s and the curved portion 350r of the thin film encapsulation layer 150 may be directly connected to each other without an auxiliary straight portion. In addition, the second straight portion 352s and the curved portion 350r may be directly connected to each other without an additional auxiliary straight portion.

The first straight portion 351s and the second straight portion 352s may be parallel to each other. However, the present invention is not limited thereto, and the first straight portion 151s and the second straight portion 152s may be formed to have a predetermined angle with respect to each other, (for example, a predetermined angle in a range of about 0 degrees to about 20 degrees). The first straight portion 151s and the second straight portion 152s may face each other.

The curved portion 150r may have a circular shape corresponding to the shape of the display unit 10. In an exemplary embodiment of the present invention, the curved portion 150r may be formed with a constant radius of curvature.

The substrate 110 may include various materials, for example, glass, metal, or plastic. According to an exemplary embodiment of the present invention, the substrate 110 may include a flexible material. The terms "substrate 110" and a "flexible material substrate 110" may be interchangeably used to describe the substrate 110. The flexible material substrate 110 may be bent, folded, or rolled. The flexible material substrate 110 may include ultra slim glass, metal, or plastic. For example, when plastic is used in the flexible material substrate 110, the flexible material substrate 110 may include polyimide (PI). However, the flexible material substrate 110 may also include other flexible plastics or other flexible materials.

The substrate 310 may include straight portions and curved portions. The straight portions may be formed to have a constant radius of curvature. The shape of the substrate 310 may correspond to the shape of the display unit 10.

Referring to FIG. 6, a display apparatus 400 includes the flexible material substrate 110, which includes a circular display area DA and a peripheral area PA disposed around the display area DA, a display unit 10 disposed in the display area DA, and a thin film encapsulation layer 150 that seals the display unit 10. In plan view, an edge of the thin film encapsulation layer 150 includes a first straight portion 151s, a second straight portion 152s separated from the first straight portion 151s, and a curved portion 150r disposed between the first straight portion 151s and the second straight portion 152s.

The substrate 110 may include various materials, for example, glass, metal, or plastic. According to an exemplary embodiment of the present invention, the substrate 110 may include a flexible material. The teams "substrate 110" and a "flexible material substrate 110" may be interchangeably used to describe the substrate 110. The flexible material substrate 110 may be bent, folded, or rolled. The flexible material substrate 110 may include ultra slim glass, metal, or plastic. For example, when plastic is used in the flexible material substrate 110, the flexible material substrate 110 may include polyimide (PI). However, the flexible material substrate 110 may also include other flexible plastics or other flexible materials.

The substrate 410 may have various shapes in plan view, for example, a rectangular shape, a pentagonal shape, a hexagonal shape, etc.

Figure 7:
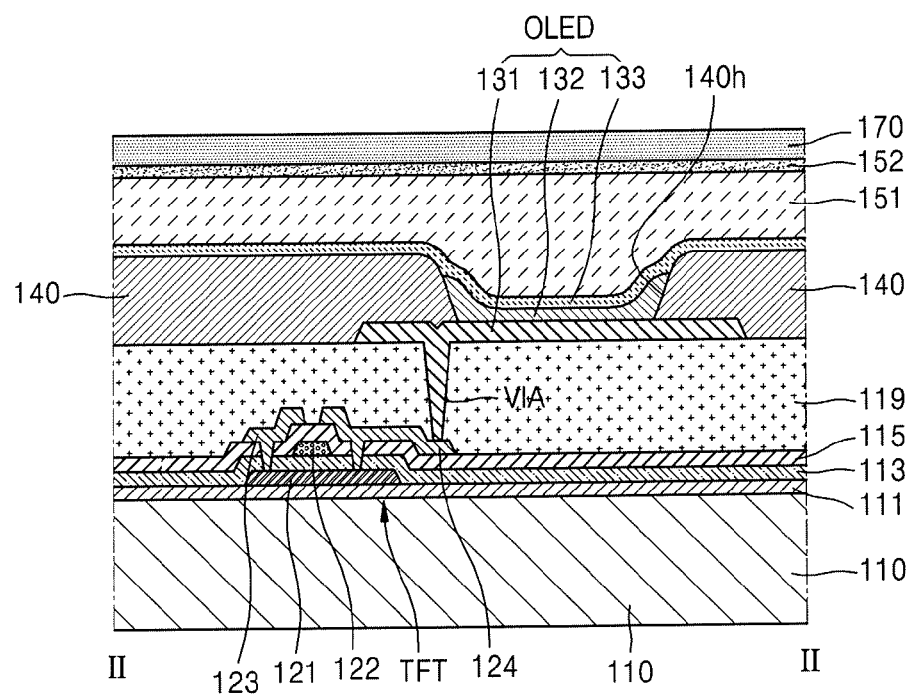
FIG. 7 is a cross-sectional view taken along line II-II' of FIG. 1.

FIG. 7 is a cross-sectional view taken along line II-IP of FIG. 1.

Referring to FIG. 7, the display apparatus 100 includes the flexible material substrate 110, a TFT, a via insulating film 119, an OLED, a pixel defining film 140, and the thin film encapsulation layer 150. The thin film encapsulation layer 150 may include at least one organic film 151 and at least one inorganic film 152. The display apparatus 100 may further include the upper film 170.

The substrate 110 may include various materials, for example, glass, metal, or plastic. According to an exemplary embodiment of the present invention, the substrate 110 may include a flexible material. The terms "substrate 110" and a "flexible material substrate 110" may be interchangeably used to describe the substrate 110. The flexible material substrate 110 may be bent, folded, or rolled. The flexible material substrate 110 may include ultra slim glass, metal, or plastic. For example, when plastic is used in the flexible material substrate 110, the flexible material substrate 110 may include polyimide (PI). However, the flexible material substrate 110 may also include other flexible plastics or other flexible materials.

A buffer film 111 that prevents impurity elements from penetrating into the flexible material substrate 110, and planarizes a surface of the flexible material substrate 110, may be formed on the flexible material substrate 110. The TFT may be disposed on the buffer film 111 in the display area DA of the flexible material substrate 110. A barrier layer may further be disposed between the flexible material substrate 110 and the buffer film 111. The buffer film 111 and/or the barrier layer may be omitted when needed.

The TFT and a capacitor may be included in a circuit that passes a driving signal to the OLED.

The TFT may include an active layer 121 disposed on the buffer film 111, a gate electrode 122 disposed on at least a portion of the active layer 121, a source electrode 123 to which a data signal is applied, and a drain electrode 124 that is electrically connected to a pixel electrode 131. A gate insulating film 113 may be disposed between the active layer 121 and the gate electrode 122, and an interlayer insulating 115 may be disposed between the gate electrode 122 and the source and drain electrodes 123 and 124.

The active layer 121 may include a semiconductor material, for example, an amorphous silicon or poly crystalline silicon. However, the present invention is not limited thereto. For example, according to an exemplary embodiment of the present invention, the active layer 121 may include an organic semiconductor material or an oxide semiconductor material.

The gate electrode 122 may be connected to a gate wire that applies an ON/OFF signal to the TFT, and may include a low resistance electrically-conductive material. For example, the gate electrode 122 may be a single layer film of a multilayer film including a conductive material, such as Mo, Al, Cu, and/or Ti.

Each of the source and drain electrodes 123 and 124 may be a single layer film or a multilayer film including a conductive material. The source and drain electrodes 123 and 124 may be respectively connected to a source region and a drain region of the active layer 121.

According to an exemplary embodiment of the present invention, the TFT is a top gate type in which the gate electrode 122 is disposed above the active layer 121, but an exemplary embodiment of the present invention is not limited thereto. For example, according to an exemplary embodiment of the present invention, the TFT may be a bottom gate type in which the gate electrode 122 is disposed below the active layer 121.

Each of the gate insulating film 113 and the interlayer insulating 115 may be single layer films or multilayer films including an inorganic material, for example, $SiO_2$, $SiN_x$, $SiON$, $Al_2O_3$, $TiO_2$, $Ta_2O_5$, $HfO_2$, and/or $ZrO_2$.

The buffer film 111, the gate insulating film 113, and the interlayer insulating film 115 may be disposed in the display area DA and may extend in the peripheral area PA. According to an exemplary embodiment of the present invention, the buffer film 111, the gate insulating film 113, and the interlayer insulating film 115 may be disposed on a region of the flexible material substrate 110 adjacent to the outermost edge of the flexible material substrate 110.

The via insulating film 119 may cover the TFT and may be planarized to remove a protrusion of the via insulating film 119 caused by the step-like structure of the TFT. The via insulating film 119 may be a single layer film or a multilayer film including an organic material. However, the present invention is not limited thereto. For example, according to an exemplary embodiment of the present invention, the via insulating film 119 may include an inorganic insulating film and an organic insulating film stacked on each other.

The OLED may be disposed on the via insulating film 119. The OLED may include a pixel electrode 131 and a common electrode 133 facing the pixel electrode 131. An organic light-emitting layer 132 is disposed between the pixel electrode 131 and the common electrode 133.

The pixel electrode 131 may be disposed on the via insulating film 119, and may be electrically connected to the TFT through a via hole VIA included in the via insulating film 119. The pixel electrode 131, as shown in FIG. 7, is electrically connected to the drain electrode 124, but the present invention is not limited thereto. For example, according to an exemplary embodiment of the present invention, the pixel electrode 131 may be electrically connected to the source electrode 123.

The pixel electrode 131 may include a material having a high work function. When the OLED is a bottom emission type in which an image is displayed through the flexible material substrate 110, the pixel electrode 131 may include a transparent conductive oxide, for example, indium tin oxide (ITO), indium zinc oxide (IZO), zinc oxide (ZnO), indium oxide ($In_2O_3$), indium gallium oxide (IGO), and/or aluminum zinc oxide (AZO).

According to an exemplary embodiment of the present invention, when the OLED is a top emission type in which an image is displayed through the common electrode 133, the pixel electrode 131 may further include a metal reflection film including Ag, Mg, Al, Pt, Pd, Au, Ni, Nd, Ir, or Cr in addition to a transparent conductive oxide.

The pixel defining film 140 may be disposed on an edge region of the pixel electrode 131, and the organic light-emitting layer 132 may be disposed on a central region of the pixel electrode 131, for example, a region of the pixel electrode 131 that is not covered by the pixel defining film 140.

The organic light-emitting layer 132 may include a low molecular weight organic material or a polymer organic material. A hole injection layer (HIL), a hole transport layer (HTL), an electron transport layer (ETL), or an electron injection layer (EIL) may be further disposed between the pixel electrode 131 and the common electrode 133, in addition to the organic light-emitting layer 132. According to an exemplary embodiment of the present invention, various functional layers may be further disposed between the pixel electrode 131 and the common electrode 133, in addition the layers described above.

One organic light-emitting layer 132 may be disposed in a single OLED, and, in this case, the OLED may emit red, green, or blue light depending on the type of the organic light-emitting layer 132 included in the OLED. However, the present invention is not limited thereto, and a plurality of the organic light-emitting layers 132 may be disposed in a single OLED. For example, white light may be emitted by vertically stacking or mixing a plurality of the organic light-emitting layers 132 that emit red, green, or blue light. In this case, a color conversion layer or a color filter that changes the emitted white light into light of a predetermined color may further be included. A combination of lights of red, green, and blue color is exemplarily illustrated in achieving white light. It is understood that lights of various other colors may be combined to emit white light.

The common electrode 133 may be disposed on the organic light-emitting layer 132, and may include various conductive materials. For example, the common electrode 133 may include ITO, IZO, ZnO, $In_2O_3$, IGO, or AZO. According to an exemplary embodiment of the present invention, the common electrode 133 may be formed as a thin film including Li, Ca, LiF/Ca, LiF/Al, Al, Ag, Mg, or Yb. The common electrode 133 may be formed as a single layer film or a multilayer film. In the case of a bottom emission type OLED, the common electrode 133 may be a reflection electrode, and in the case of a top emission type OLED, the common electrode 133 may be a transparent or semi-transparent electrode.

The common electrode 133 may apply a common voltage to all the pixels of the display unit 10. The common electrode 133 may extend from an upper surface of the organic light-emitting layer 132 to an upper surface of the pixel defining film 140.

The pixel defining film 140 may cover an edge region of the pixel electrode 131 and includes an opening 140h that exposes a central region of the pixel electrode 131. The pixel defining film 140 may be formed to cover a circumference of the pixel electrode 131 to expose an upper surface of the pixel electrode 131. The pixel defining film 140 may include a photosensitive organic film. The pixel defining film 140 may include polyimide PI.

The pixel electrode 131 may be disposed in an area between the pixel defining film 140 and the via insulating film 119, and may overlap the opening 140h.

As described above, the thin film encapsulation layer 150 may include at least one organic film 151 and at least one inorganic film 152. The thin film encapsulation layer 150 may seal the OLED so that the OLED is not exposed to external air or foreign materials, and may be used as a flexible material to encapsulate the OLED. The thin film encapsulation layer 150 may be bent or folded since the thin film encapsulation layer 150 has a small thickness.

The organic film 151 may be disposed between the common electrode 133 and the inorganic film 152, and may block or reduce the penetration of foreign materials, such as moisture or oxygen into the OLED. The encapsulating characteristic of the organic film 151 may be increased by using the organic film 151 together with the inorganic film 152. The organic film 151 may planarize a non-uniform surface. According to an exemplary embodiment of the present invention, the organic film 151 may include various organic materials, such as an epoxy group resin, an acryl group resin, or polyimide group resin.

According to an exemplary embodiment of the present invention, the inorganic film 152 may include an oxide, a nitride, or a silicon oxynitride, such as silicon nitride ($SiN_x$), silicon oxide ($SiO_2$), or silicon oxynitride ($SiO_xN_y$). The inorganic film 152 may block or reduce the penetration of foreign materials, such as moisture or oxygen into the OLED, and may extend into the peripheral area PA (refer to FIG. 1) to the display area DA.

According to an exemplary embodiment of the present invention, a functional layer and a protection layer may further be disposed between the common electrode 133 and the thin film encapsulation layer 150. The functional layer may include a capping layer and/or an LiF layer that increases optical efficiency by controlling a refractive index of visible light emitted from the OLED, and the protection layer may include an inorganic material, such as aluminum oxide.

The upper film 170 may be disposed on the thin film encapsulation layer 150. The upper film 170 may include, for example, a polarizing film, a touch screen panel film, a protection film, or a color film.

In an exemplary embodiment of the present invention, the upper film 170 may include a polarizing film. When the upper film 170 includes a polarizing film, the upper film 170 may prevent the quality of image from being reduced by a reflection of light entering from the outside. Also, the upper film 170 may include more than one layer that may polarize light.

In an exemplary embodiment of the present invention, the upper film 170 may include a touch screen panel film. When the upper film 170 includes a touch screen panel film, the upper film 170 may include sensing patterns and a metal pattern, and the variation of capacitance of the sensing patterns may be transmitted to an integrated circuit. The upper film 170 may include a stack of films having various functions. For example, the upper film 170 may include a polarizing film, a touch screen panel film, and a protection film stacked on each other. The upper film 170 may be attached to the thin film encapsulation layer 150 by using a lamination method.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display apparatus, comprising:
a substrate including a curved display area and a peripheral area disposed around the curved display area;
a curved display unit disposed in the curved display area; and
a thin film encapsulation layer which fully covers a top surface of the curved display unit,
wherein, in plan view, an edge of the thin film encapsulation layer comprises a first straight portion, a second straight portion separated from the first straight portion, and a curved portion disposed between the first and second straight portions.

2. The display apparatus of claim 1, wherein the first straight portion and the second straight portion are substantially parallel to each other.

3. The display apparatus of claim 1, wherein a shape of the curved portion corresponds to the shape of the curved display unit.

4. The display apparatus of claim 1, further comprising a third straight portion that connects the first straight portion to the curved portion.

5. The display apparatus of claim 1, further comprising an upper film disposed on the thin film encapsulation layer.

6. The display apparatus of claim 1, wherein the thin film encapsulation layer comprises at least one organic film and at least one inorganic film.

7. The display apparatus of claim 1, further comprising a pad unit disposed in the peripheral area, wherein the pad unit is disposed adjacent to the first straight portion or adjacent to the second straight portion.

8. The display apparatus of claim 1, wherein the substrate comprises a straight portion and a curved portion, the straight and curved portions of the substrate corresponding to a shape of the thin film encapsulation layer.

9. The display apparatus of claim 1, wherein the curved display unit comprises a plurality of pixels, and each of the plurality of pixels comprises at least one thin film transistor (TFT) and an organic light-emitting diode (OLED) that is electrically connected to the at least one TFT, wherein the OLED of each of the plurality of pixels comprises a pixel electrode, an organic light-emitting layer, and a common electrode.

10. The display apparatus of claim 1, wherein the thin film encapsulation layer directly and fully covers the top surface of the curved display unit and four side surfaces of the curved display unit with the substrate directly and fully covering a bottom surface of the curved display unit, wherein the top surface of the curved display unit is a surface of the curved display unit from which an image is displayed.

11. A method of manufacturing a display apparatus, comprising:
providing a substrate including a circular display area and a peripheral area disposed around the circular display area;
forming a circular display unit in the circular display area;
forming a thin film encapsulation layer on the circular display unit, and sealing the circular display unit on the substrate with the thin film encapsulation layer; and
forming an upper film on the thin film encapsulation layer,
wherein, in plan view, an edge of the thin film encapsulation layer comprises a first straight portion, a second straight portion separated from the first straight portion, and a curved portion disposed between the first and second straight portions, and
wherein forming the upper film comprises attaching the upper film on the thin film encapsulation layer by using a roller, wherein using the roller comprises moving the roller on the upper film in a first direction, from the first straight portion towards the second straight portion of the thin film encapsulation layer, to press the upper film on the thin film encapsulation layer.

12. The method of claim 11, wherein the first straight portion and the second straight portion are substantially parallel to each other.

13. The method of claim 11, wherein the curved portion has a circular shape corresponding to a shape of the circular display unit.

14. The method of claim 11, further comprising a third straight portion that connects the first straight portion to the curved portion.

15. The method of claim 11, wherein the thin film encapsulation layer comprises at least one organic film and at least one inorganic film.

16. A display apparatus, comprising:
- a substrate including a circular display area and a peripheral area disposed at a border of the circular display area;
- a circular display unit disposed in the circular display area; and
- a thin film encapsulation layer disposed on an entire top surface of the circular display unit,
- wherein the circular display unit is disposed between the substrate and the thin film encapsulation layer,
- wherein the circular display unit is encapsulated by the substrate and thin film encapsulation layer, and
- wherein the thin film encapsulation layer includes at least two straight edges connected to each other by a curved edge.

17. The display apparatus of claim 16, wherein the thin film encapsulating layer includes an organic film and an inorganic film stacked on one another.

18. The display apparatus of claim 17, wherein a portion of the curved edge has a constant radius of curvature.

19. The display apparatus of claim 16, wherein the substrate and the thin film encapsulation layer have a same shape.

20. The display apparatus of claim 19, wherein the substrate is larger than the thin film encapsulation layer.

* * * * *